US009465907B2

(12) United States Patent
Hassan et al.

(10) Patent No.: US 9,465,907 B2
(45) Date of Patent: Oct. 11, 2016

(54) MULTI-POLYGON CONSTRAINT DECOMPOSITION TECHNIQUES FOR USE IN DOUBLE PATTERNING APPLICATIONS

(71) Applicant: GLOBALFOUNDRIES Inc., Grand Cayman (KY)

(72) Inventors: Ahmed Hassan, Clifton Park, NY (US); Nader Magdy Hindawy, Rexford, NY (US); Vikrant Chauhan, Clifton Park, NY (US); Jason Eugene Stephens, Albany, NY (US); David Pritchard, Glenville, NY (US); Abbas Guvenilir, Gansevoort, NY (US); David E. Brown, Ballston Lake, NY (US); Terry J. Bordelon, Jr., Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 30 days.

(21) Appl. No.: 14/341,092

(22) Filed: Jul. 25, 2014

(65) Prior Publication Data
US 2016/0026748 A1 Jan. 28, 2016

(51) Int. Cl.
*G06F 17/50* (2006.01)

(52) U.S. Cl.
CPC ....... *G06F 17/5081* (2013.01); *G06F 17/5068* (2013.01); *G06F 17/5072* (2013.01)

(58) Field of Classification Search
CPC .................. G06F 17/5081; G06F 17/5068; G06F 17/5072
See application file for complete search history.

(56) References Cited

U.S. PATENT DOCUMENTS

| | | | | |
|---|---|---|---|---|
| 7,378,195 B2* | 5/2008 | Graur | .................. | G03F 1/30 430/5 |
| 8,255,837 B2* | 8/2012 | Lu | .................. | G03F 1/144 716/50 |
| 8,402,396 B2* | 3/2013 | Kahng | .................. | G06F 17/50 716/110 |
| 8,434,043 B1* | 4/2013 | Hsu | .................. | G06F 17/5081 716/112 |
| 8,661,371 B1* | 2/2014 | Wang | .................. | G06F 17/5068 716/52 |
| 8,677,297 B2* | 3/2014 | Chase | .................. | G06F 17/5081 716/111 |
| 8,689,151 B1* | 4/2014 | Agarwal | .................. | G03F 7/70466 716/50 |
| 8,732,628 B1* | 5/2014 | Wu | .................. | G03F 1/38 430/30 |
| 8,756,550 B2* | 6/2014 | Blatchford | .................. | H01L 27/0207 430/30 |
| 8,869,075 B2* | 10/2014 | Sun | .................. | G06F 17/5081 716/51 |
| 8,935,639 B1* | 1/2015 | Tzeng | .................. | G06F 17/5077 430/30 |
| 2010/0196803 A1* | 8/2010 | Lu | .................. | G03F 1/144 430/5 |
| 2013/0159955 A1* | 6/2013 | Ghaida | .................. | G06F 17/5081 716/119 |

\* cited by examiner

*Primary Examiner* — Naum B Levin
(74) *Attorney, Agent, or Firm* — Amerson Law Firm, PLLC

(57) ABSTRACT

One illustrative method disclosed herein involves, among other things, decomposing an initial circuit layout into first and second mask patterns, for the first mask pattern, identifying a first four-polygon pattern in the first mask pattern that violates a multi-polygon constraint rule, wherein the first four-polygon pattern comprises four polygons positioned side-by-side in the first mask pattern, and recoloring one or two of the polygons in the first four-polygon pattern in the first mask pattern to the second mask pattern to eliminate the first four-polygon pattern from the first mask pattern without introducing any design rule violations in the initial circuit layout.

20 Claims, 8 Drawing Sheets

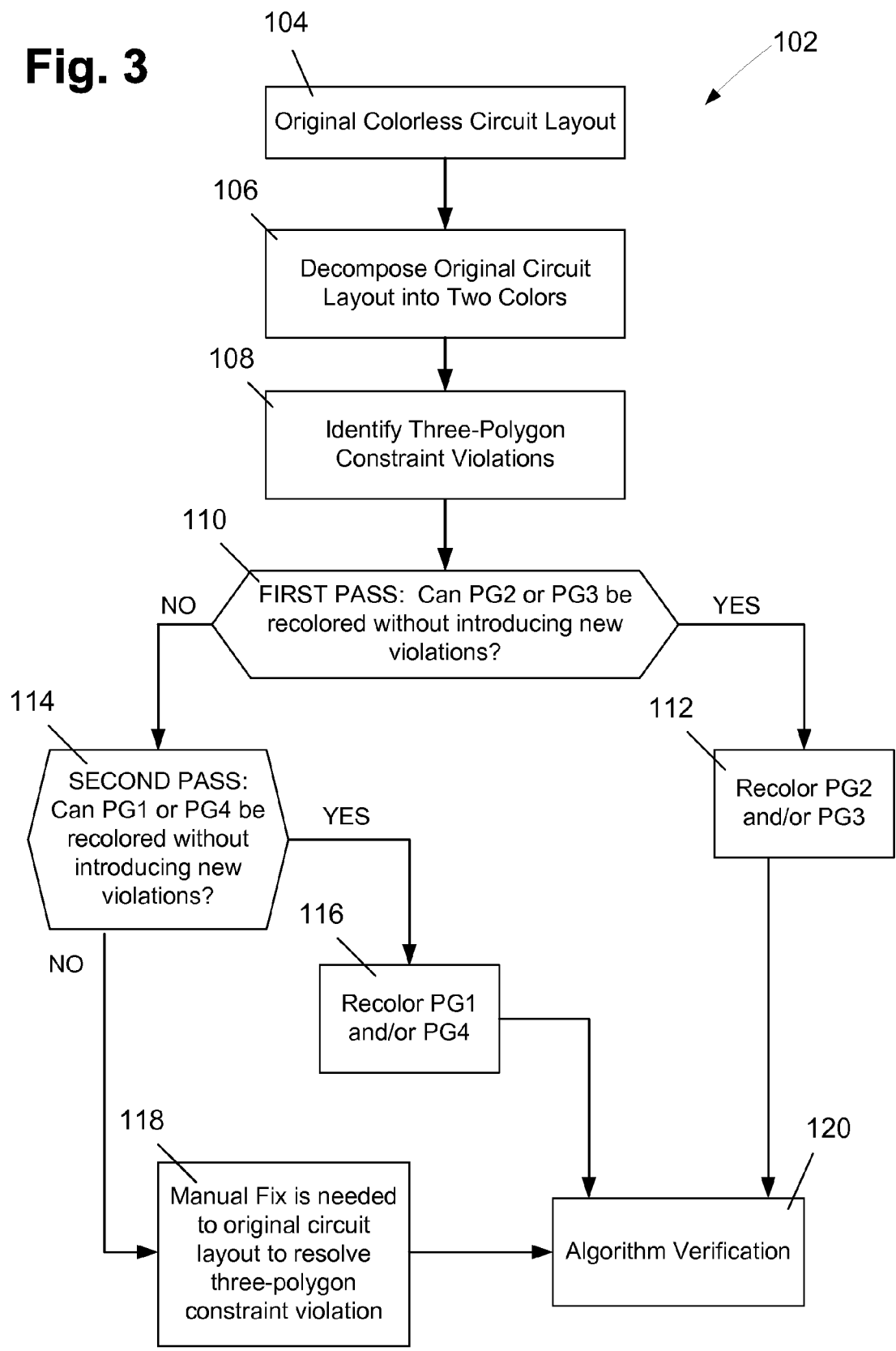

MULTI-POLYGON CONSTRAINT DECOMPOSITION TECHNIQUES FOR USE IN DOUBLE PATTERNING APPLICATIONS

BACKGROUND OF THE INVENTION

1. Field of the Invention

Generally, the present disclosure relates to the manufacture of semiconductor devices, and, more specifically, to various methods that involve multi-polygon constraint decomposition when using double patterning techniques to manufacture integrated circuit products.

2. Description of the Related Art

Integrated circuit products, or ICs, are generally created by patterning several layers of material so as to define the various devices and components, e.g., transistors, resistors, capacitors, etc., that are used to make the product. Generally, the process starts with the design of the integrated circuit using electronic design automation (EDA) tools that allow a designer to interactively position and connect various components of the overall circuit. This design, in turn, is generated into a circuit layout by the electronic design automation tool. The circuit layout, also known simply as a layout, contains the physical locations and dimensions of the circuit's components, interconnections and various layers of the product. The components, interconnections and various layers of the circuit form the features of the integrated circuit. As noted above, the integrated circuit design is eventually fabricated by transferring the circuit layout to a semiconductor substrate in a series of layers that collectively will form the features that constitute the devices that make up the components of the integrated circuit. However, before the layout can be fabricated, a validation process of the circuit layout must take place to insure that it can actually be fabricated using existing tools and techniques.

Design Rule Checking (DRC) is the area of electronic design automation (EDA) that determines whether the physical layout of a particular chip layout satisfies a series of recommended parameters called design rules. Design rule checking is a major step during physical verification of the chip design. At a very high level, design rules are a series of parameters provided by a semiconductor manufacturer that establish certain spacing relationships between adjacent structures so that the circuit layout can actually be manufactured using existing tools and techniques. The design rules enable the chip designer to verify the manufacturability of a product layout and the mask sets (reticles) used in manufacturing the integrated circuit product. Advanced processes and products may involve the use of more restrictive design rules in an effort to improve product yield.

Design rules may be specific to a particular semiconductor manufacturing process and/or product. In general, a design rule set specifies certain geometric and connectivity restrictions between the features of the layout, e.g., gate structures, metal lines, etc., to ensure sufficient margins to account for variability in semiconductor manufacturing processes and to ensure that the circuits work as intended. Typically, there are several basic types of design rules that semiconductor manufacturers employ, e.g., width rules, spacing rules and pitch rules. A width rule specifies the smallest allowable width of any shape in the design, i.e., the width of a metal line or a gate electrode structure. A spacing rule specifies the minimum distance between two adjacent features, like the spacing between two adjacent metal lines. Spacing rules can vary depending upon the nature of the relationship between the two adjacent features, e.g., corner-to-corner spacing, tip-to-side spacing, side-to-side spacing, tip-to-tip spacing, etc. The magnitude of the space allowed by these various spacing rules will likely not be the same in all situations, e.g., the allowable tip-to-tip spacing may be different from the allowable side-to-side spacing. Additionally, the magnitude of the allowed spacing will likely be tighter (smaller) for more advanced products and processes as compared to older product generations. These single layer rules will exist for each layer of a semiconductor product, with the lowest levels typically having the tightest or most restrictive design rules and the highest metal layers on the product typically having larger, less restrictive design rules.

Typically, the design validation process is handled by a verification tool, which processes a circuit layout and verifies that the layout adheres to a set of specified design rules. One such verification tool is sometimes referred to as a design rule checker. Often times the design rule checker is implemented as a stand-alone software program, such as Cadence Assura® DRC, or as a part of an electronic design automation tool, such as Cadence Virtuoso® The design rule checker examines a layout for violations of a set of specified design rules. The layout is usually received by the design rule checker in the form of a file that digitally represents the layout of the circuit. Current formats for layout files include, but are not limited to, GDS II and OASIS. When a design rule checker observes a circuit feature within the layout that violates a particular design rule, the violation is flagged by the design rule checker. Examples of how this flagged violation can be brought to the designer's attention include, but are not limited to, marking the violation directly in a resulting output layout file or graphically bringing attention to the violation within the electronic design automation tool.

As it relates to actually manufacturing a product, photolithography is one of the basic processes used in manufacturing integrated circuit products. At a very high level, photolithography involves: (1) forming a layer of light or radiation-sensitive material, such as a photoresist material, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the final circuit layout (design) on the integrated circuit product. Historically, the pitches between features in integrated circuit products were large enough such that a desired pattern could be formed using a single patterned photoresist masking layer. However, in recent years, device dimensions and pitches have been reduced in size to the point where existing photolithography tools, e.g., 193 nm wavelength photolithography tools, cannot form a single patterned photoresist mask layer that includes all of the features of the overall target pattern. Accordingly, device designers have resorted to techniques that involve performing multiple exposures to define a single target pattern in a layer of material. One such technique is generally referred to as double patterning or double patterning technology (DPT). In general, double patterning is an exposure method that involves splitting (i.e., dividing or separating) a dense overall target circuit pattern into two separate, less-dense patterns. The simplified, less-dense patterns are then printed separately utilizing two separate photoresist masks (where one of the photoresist masks is utilized to image one of the less-dense patterns, and the other photoresist mask is utilized to image the other less-dense pattern). This technique effectively enables the printing of even smaller features than would otherwise be possible using a single photoresist mask using existing photolithography tools. There are several double patterning techniques employed by semiconductor manufacturers, all of which are well known to those skilled in the art, e.g., Litho-Litho-Etch, Litho-Etch-Litho-Etch, etc.

To use double patterning techniques, an overall target pattern must be what is referred to as double-patterning-compliant. In general, this means that an overall target pattern is capable of being decomposed into two separate patterns that each may be printed in a single layer of photoresist using existing photolithography tools. Layout designers sometimes refer to such patterns with reference to "colors." In general, the original circuit layout may be considered to be "colorless." During the decomposition process, a first mask will be represented in the EDA tool using a first color and the second mask will be represented in the EDA tool using a second, different color. To the extent a layout is non-double-patterning-complaint, it is sometimes stated to present a "coloring conflict" between the two masks. An overall target pattern may have many regions or areas that cannot be printed because the features in those regions are spaced too closely to one another for existing photolithography tools to be able to print such closely spaced features as individual features.

If a layout cannot be separated or "decomposed" or "colored" into two separate masks, the problem can be addressed by changing the original circuit layout. The circuit layout is usually changed manually by a designer reviewing the output from design rule checking software. However, changing a circuit layout is a time-consuming and expensive process. Additionally, a change to one portion of a circuit layout often may have the undesirable effect of changing other portions or regions of the circuit layout. A designer must evaluate many alternate fixes before determining the best solution.

While existing EDA tools and techniques are used to resolve conflicts based upon many design rules, as noted above, existing EDA tools and techniques do not resolve so-called multi-polygon constraint rules. Many of the design rules mentioned above confirm the acceptability of a circuit layout for manufacturing based upon an analysis of spacing requirement between one polygon, e.g., a metal line, and one or more adjacent polygons that are to be formed on the same mask layer. However, the manufacture of semiconductor devices is very complex and there may be situations where the manufacturability of a particular circuit layout may be adversely impacted by the proximity of a collection of polygons that are arranged in a particular pattern on a single mask layer.

For example, FIG. 1A is a simplistic depiction of one of the two colored masks that results from performing a decomposition process on an initial circuit layout (not shown). As depicted, one of the masks 10 includes a pattern of three illustrative polygons, PG1-PG3, that are in the form of vertically oriented, rectangular-shaped features, e.g., features that correspond to gate electrodes, metal lines, etc. Device manufacturers have learned that, when trying to form a pattern of three adjacent polygons (arranged side-by-side) in a single masking layer, there must be a minimum spacing 12 (a multi-polygon constraint rule, e.g., a minimum dimension (nm)) between the sides of the three adjacent polygons so that the device can be manufactured. The magnitude of the multi-polygon constraint rule will vary depending upon a variety of factors, e.g., the device under construction, the sophistication of the process tools and manufacturer, etc. Moreover, the magnitude of the multi-polygon constraint rule may be different (typically larger) depending upon the proximity of other adjacent polygons to the three polygons depicted in FIG. 1A. For example, if a horizontally-oriented line (not shown) was also positioned on the mask 10 above the three depicted polygons PG1-PG3, the magnitude of the multi-polygon constraint rule would be larger than the multi-polygon constraint rule for the case where only the three polygons are present.

FIG. 1B depicts a situation in which another decomposed mask 14 includes a four-polygon pattern, PG1-PG4. The "X" in FIG. 1B indicates a situation where the spacing between the adjacent polygons is less than the value of the multi-polygon constraint rule. Accordingly, the mask 14 cannot be manufactured. Thus, although existing EDA tools might indicate that the mask 14 shown in FIG. 1B with the four-polygon pattern PG1-PG4 can be manufactured using double patterning techniques, device manufacturers have learned that, due to the presence of the four-polygon pattern (PG1-PG4) shown in FIG. 1B (in a single mask that violates the multi-polygon constraint rule), the four-polygon pattern reflected in the mask 14 cannot be readily manufactured.

The present disclosure is directed to various methods that involve multi-polygon constraint decomposition when using double patterning techniques to manufacture integrated circuit products which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods that involve multi-polygon constraint decomposition when using double patterning techniques to manufacture integrated circuit products. One illustrative method disclosed herein involves, among other things, decomposing an initial circuit layout into first and second mask patterns, for the first mask pattern, identifying a first four-polygon pattern in the first mask pattern that violates a multi-polygon constraint rule, wherein the first four-polygon pattern comprises four polygons positioned side-by-side in the first mask pattern, and recoloring one or two of the polygons in the first four-polygon pattern in the first mask pattern to the second mask pattern to eliminate the first four-polygon pattern from the first mask pattern without introducing any design rule violations in the first mask pattern.

Another illustrative method disclosed herein includes, among other things, decomposing an initial circuit layout into first and second mask patterns, for the first mask pattern, identifying first and second four-polygon patterns in the first mask pattern that violate a multi-polygon constraint rule, wherein each of the first and second four-polygon patterns comprises two outer polygons and two inner polygons positioned between the two outer polygons, recoloring one of the two inner polygons in the first four-polygon pattern to the second mask pattern while leaving the two outer polygons of the first four-polygon pattern in the first mask pattern to eliminate the first four-polygon pattern from the first mask pattern without introducing any design rule violations in the first mask pattern, and recoloring at least one of the two outer polygons in the second four-polygon pattern to the second mask pattern while leaving the two inner polygons of the second four-polygon pattern in the first mask pattern to eliminate the second four-polygon pattern from the first mask pattern without introducing any design rule violations in the first mask pattern.

Another illustrative method disclosed herein includes, among other things, decomposing an initial circuit layout into first and second mask patterns, for the first mask pattern, identifying first and second four-polygon patterns in the first mask pattern that violate a multi-polygon constraint rule, wherein each of the first and second four-polygon patterns comprises two outer polygons and two inner polygons positioned between the two outer polygons, and recoloring one of the two inner polygons in the first four-polygon pattern to the second mask pattern while leaving the two outer polygons of the first four-polygon pattern in the first mask pattern to eliminate the first four-polygon pattern from the first mask pattern without introducing any design rule violations in the first mask pattern.

Yet another illustrative method disclosed herein includes, among other things, decomposing an initial circuit layout into first and second mask patterns, for the first mask pattern, identifying first and second four-polygon patterns in the first mask pattern that violate a multi-polygon constraint rule, wherein each of the first and second four-polygon patterns comprises two outer polygons and two inner polygons positioned between the two outer polygons, and recoloring at least one of the two outer polygons in the second four-polygon pattern to the second mask pattern while leaving the two inner polygons of the second four-polygon pattern in the first mask pattern to eliminate the second four-polygon pattern from the first mask pattern without introducing any design rule violations in the first mask pattern.

BRIEF DESCRIPTION OF THE DRAWINGS

The disclosure may be understood by reference to the following description taken in conjunction with the accompanying drawings, in which like reference numerals identify like elements, and in which:

FIG. 3 depicts, in flowchart form, various illustrative embodiments of the novel methods disclosed herein;

Figure 1A:
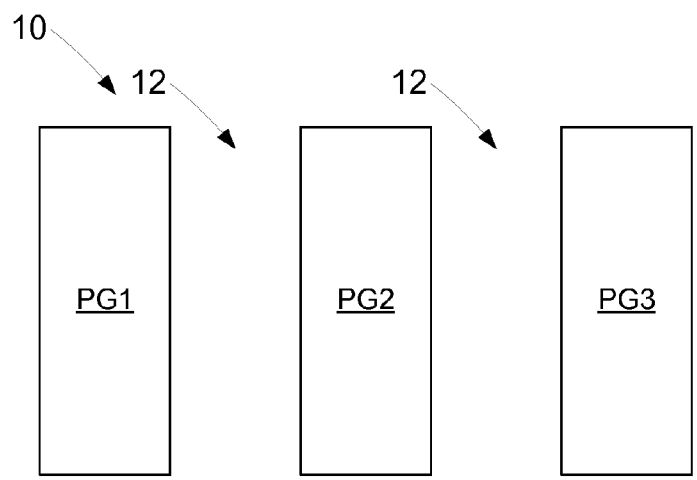
FIG. 1A simplistically depicts one illustrative prior art arrangement of three polygons on a single masking layer that do not violate a multi-polygon constraint rule and thus can be readily manufactured.
Figure 1B:
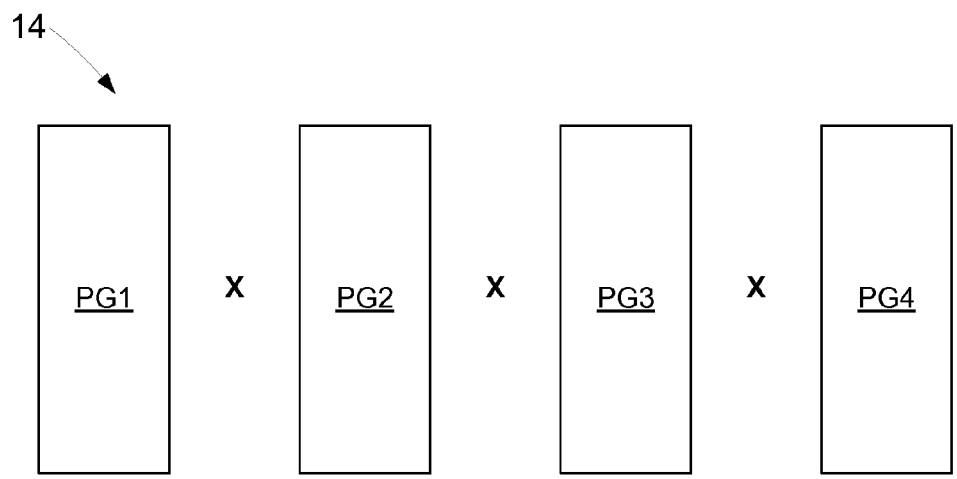
FIG. 1B simplistically depicts one illustrative prior art arrangement of four polygons on a single masking layer that violates a multi-polygon constraint rule and thus cannot be readily manufactured.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods that involve multi-polygon constraint decomposition when using double patterning techniques to manufacture integrated circuit products. As will be readily apparent to those skilled in the art upon a complete reading of the present application, the methods and devices disclosed herein may be employed in the design and fabrication of a variety of devices, such as logic devices, memory devices, ASICs, etc. With reference to the attached figures, various illustrative embodiments of the methods and systems disclosed herein will now be described in more detail.

Figure 2:
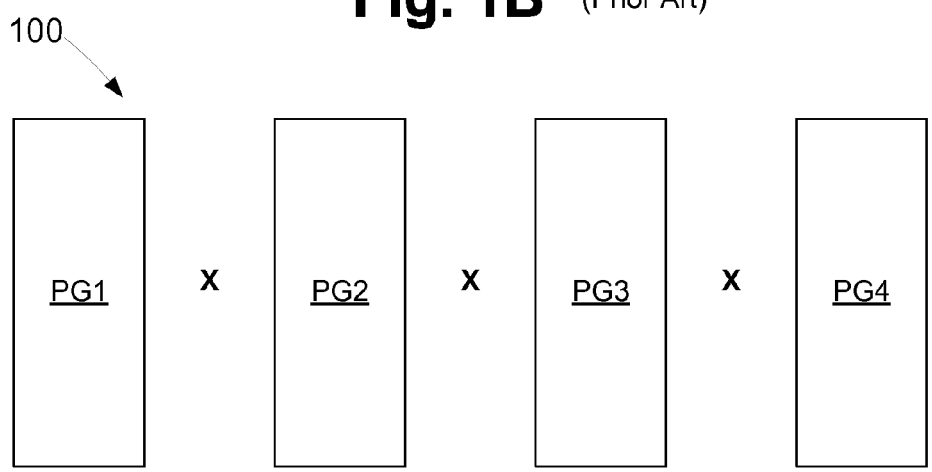
FIG. 2 is a simplistic depiction of a four-polygon pattern on a single masking layer that violates a multi-polygon constraint rule, wherein various methods disclosed herein may be employed to reduce or eliminate the existence of such a pattern when using double patterning techniques to manufacture integrated circuit products.

FIG. 2 is a simplistic depiction of a colored mask 100 that includes a four-polygon pattern (PG1-PG4) that violates a multi-polygon constraint rule (as indicated by the "X") for the device to be fabricated, wherein the various methods disclosed herein may be employed to reduce or eliminate the existence of such violating multi-polygon patterns when using double patterning techniques to manufacture integrated circuit products.

FIG. 3 depicts, in flowchart form, one illustrative embodiment 102 of the various methods disclosed herein. The method begins with identifying, obtaining or being provided an original colorless circuit layout, as indicated in block 104. Next, the circuit layout is decomposed into two separate masks, i.e., it is decomposed into two different colors, as indicated in block 106. The decomposition of the original circuit layout may be accomplished using any of a variety of known decomposition tools and techniques, all of which are well known to those skilled in the art. Next, as shown in block 108, one of the two colored masks is examined to identify the existence of all four-polygon patterns that violate a three-polygon constraint rule, i.e., "three-polygon constraint violations." Of course, the process depicted in FIG. 3 will eventually be performed on both of the colored masks that result from the decomposition of the original circuit layout.

Figure 4A:
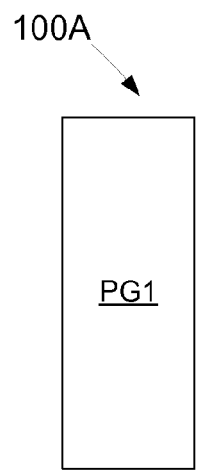
FIGS. 4A-4E simplistically depict possible solutions to a circuit layout that contains a four-polygon pattern that violates a multi-polygon constraint rule when decomposed.
Figure 4B:
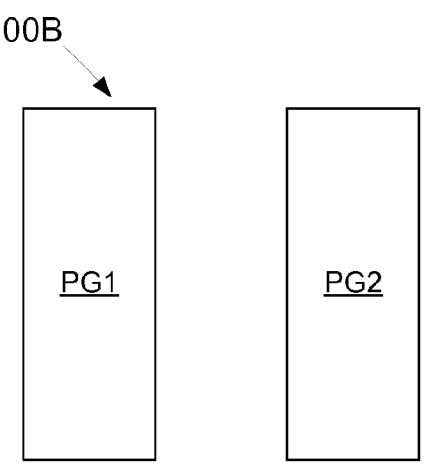

With continuing reference to FIG. 3, in one embodiment, the first process (FIRST PASS) involves trying to recolor one of the two inner polygons (PG2 and/or PG3) of the violating four-polygon pattern shown in FIG. 2 to eliminate the identified violating pattern without introducing any other design rule violations within the particular mask at issue, as indicated at decision block 110. If recoloring one of the two inner polygons (PG2 and/or PG3) of the violating four-polygon pattern actually eliminates the three-polygon rule violation (the "YES" branch from block 110), then the polygon PG2 and/or the polygon PG3 are recolored to the other mask, as indicated in block 112. FIGS. 4A-4B depict the possible solutions that may be tried at this point in the method disclosed herein. FIG. 4A depicts the situation where the polygon PG2 has been recolored such that mask 100A now only contains three polygons PG1, PG3 and PG4. FIG. 4B depicts the situation where the polygon PG3 has been recolored such that mask 100B now only contains three polygons PG1, PG2 and PG4.

Figure 4C:
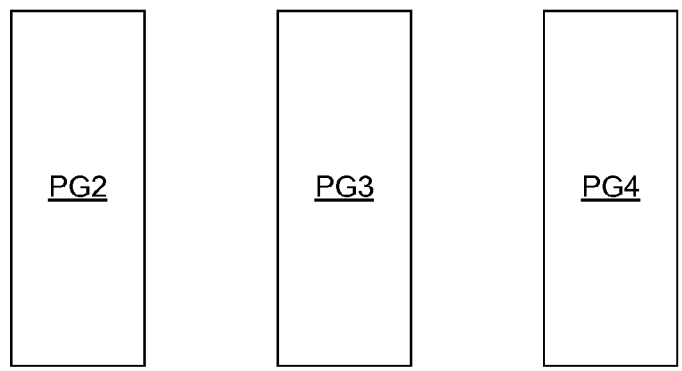
Figure 4D:
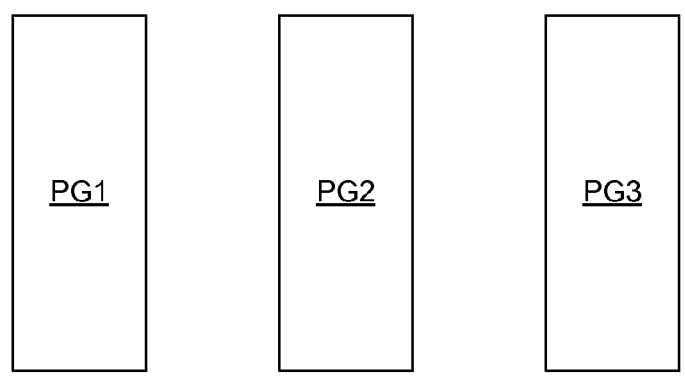
Figure 4E:
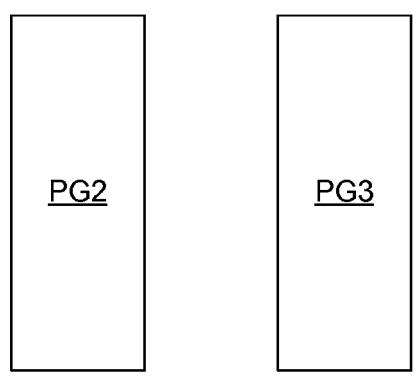

Returning to FIG. 3, if the first process (FIRST PASS) cannot be performed without introducing one or more new design rule violations to within the particular mask at issue (the "NO" branch from block 110), then, as indicated at decision block 114, the method involves performing a second process (SECOND PASS) to try to recolor at least one of the two outer polygons (PG1 and/or PG4) of the four-polygon pattern shown in the mask 100 in FIG. 2 to eliminate the identified three-polygon rule violation without introducing any other design rule violations to within the mask at issue. If recoloring one or both of the two outer polygons (PG1 and/or PG4) of the four-polygon pattern actually eliminates the three-polygon rule violation, then the polygon PG1 and/or the polygon PG4 are recolored, as indicated in block 116. FIGS. 4C-4E depict the possible solutions that may be tried at this point in the method disclosed herein. FIG. 4C depicts the situation where the polygon PG1 has been recolored such that mask 100D now only contains three polygons PG2, PG3 and PG4. FIG. 4D depicts the situation where the polygon PG4 has been recolored such that mask 100E now only contains three polygons PG1, PG2 and PG3. FIG. 4E depicts the situation where the polygons PG1 and PG4 have been recolored such that mask 100F now only contains two polygons PG2 and PG3.

With continuing reference to FIG. 3, if the second process (SECOND PASS) cannot be performed without introducing one or more new design rule violations into the mask at issue (the "NO" branch from block 114), then the method involves performing a manual fix to the original circuit layout to eliminate the identified four-polygon pattern that caused the original three-polygon rule violation. Obviously, a designer will be involved in making any such manual fix to the original circuit layout.

As shown in FIG. 3, under any of the three situations performed to the eliminate the violating four-polygon pattern, i.e., a first pass recoloring (block 112), a second pass recoloring (block 116) or a manual fixing of the original circuit layout (block 118), the methods disclosed herein involve verifying that the new coloring arrangement and/or the manually fixed circuit layout are in compliance with all design rules, as indicated in block 120. In the case where one or more of the polygons in the original pattern is recolored, the verification in block 120 would include, among other things: (1) confirming that all polygons in the original circuit layout are present in the combination of the two recolored masks; and (2) confirming that each of the polygons in the original circuit layout is present in only one of the two colored masks, i.e., a particular polygon is not present on both masks.

Figure 5A:
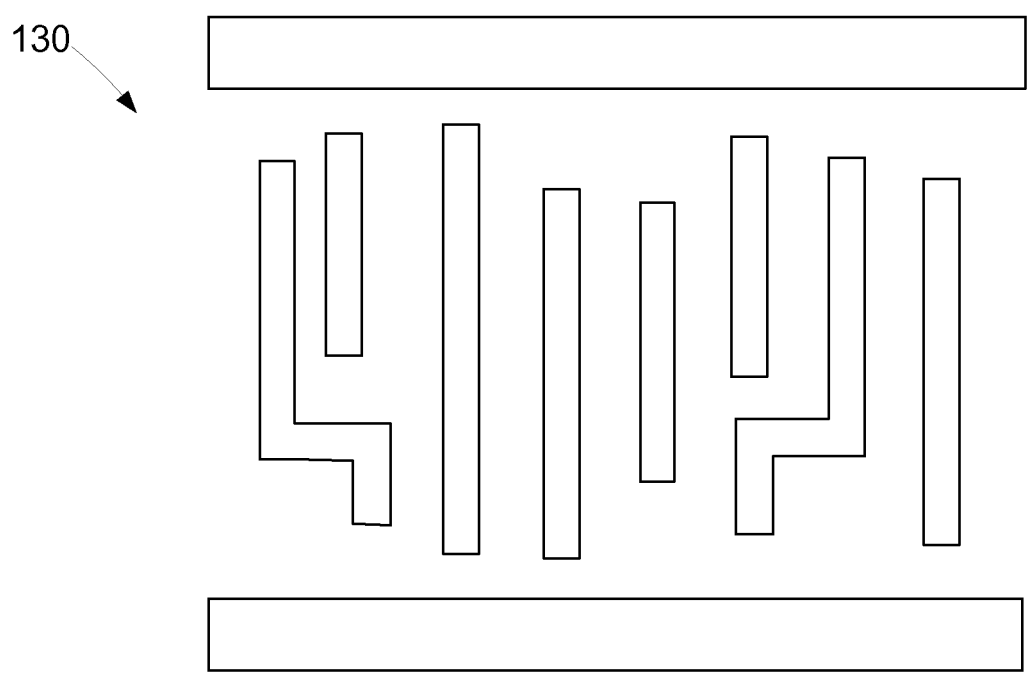
FIGS. 5A-5C depict one illustrative example of how the methods disclosed herein may be employed to reduce the number of multi-polygon constraint rule violations on a decomposed circuit layout.
Figure 5B:
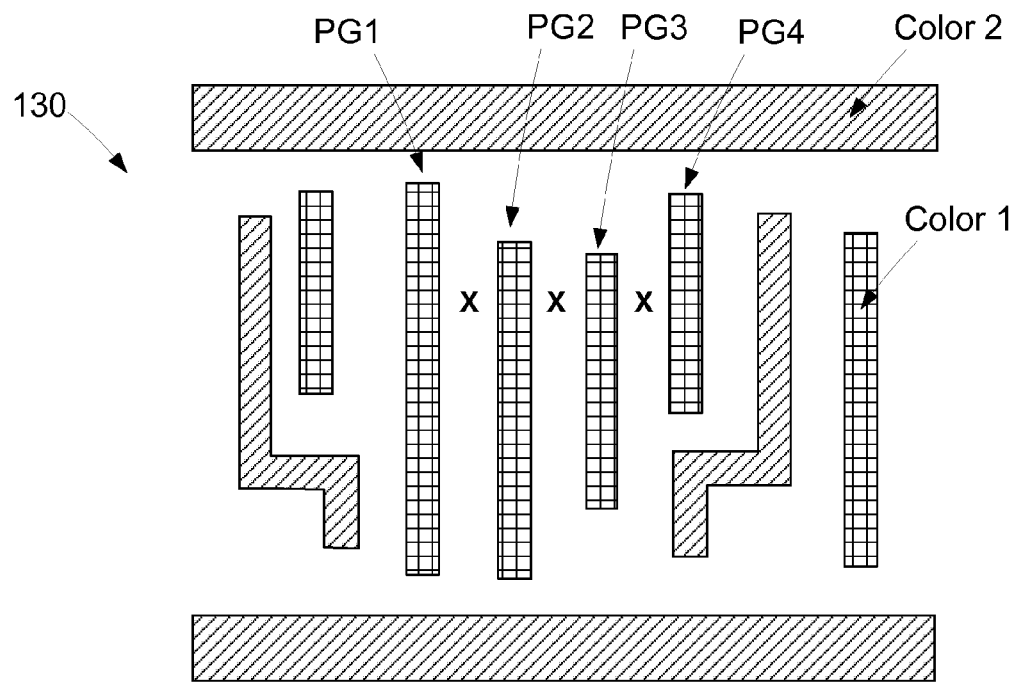
Figure 5C:
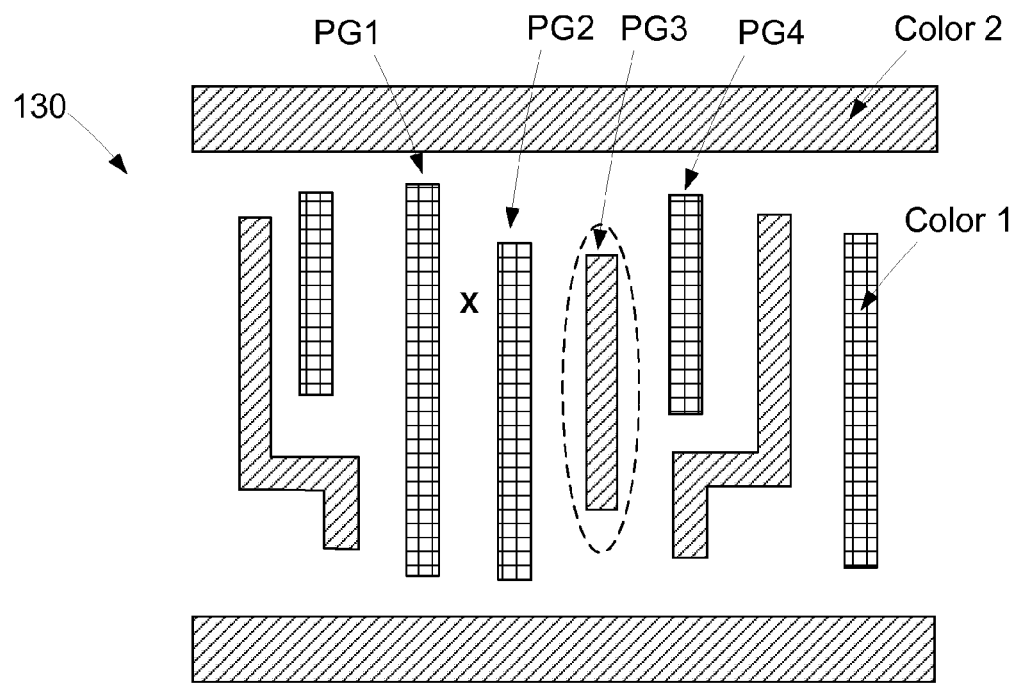

FIGS. 5A-5C depict one illustrative example of how the methods disclosed herein may be employed to reduce the number of multi-polygon constraint rule violations on a decomposed circuit layout. FIG. 5A depicts an original circuit layout 130 that must be manufactured using double patterning techniques. FIG. 5B depicts the layout after it has been decomposed into two different masks (Color 1 and Color 2) that are indicated by different shading. As indicated, the Color 1 mask contains a four-polygon pattern, PG1-PG4. The "X" in FIG. 5B indicates a situation where the spacing between the adjacent polygons in the four-polygon pattern is less than the value of the multi-polygon constraint rule, a rule violation. Accordingly, the four-polygon pattern reflected in the Color 1 mask cannot be manufactured. FIG. 5C depicts an example of where the methods disclosed herein were used to eliminate the violating pattern in the Color 1 mask. More specifically, FIG. 5C depicts a situation where the "FIRST PASS" aspect (FIG. 3, block 112) of the methods disclosed herein was used to eliminate the violating pattern by recoloring PG3 such that it is now on the Color 2 mask. Accordingly, the three polygon pattern reflected in the modified Color 1 mask depicted in FIG. 5C can be manufactured.

Figure 6A:
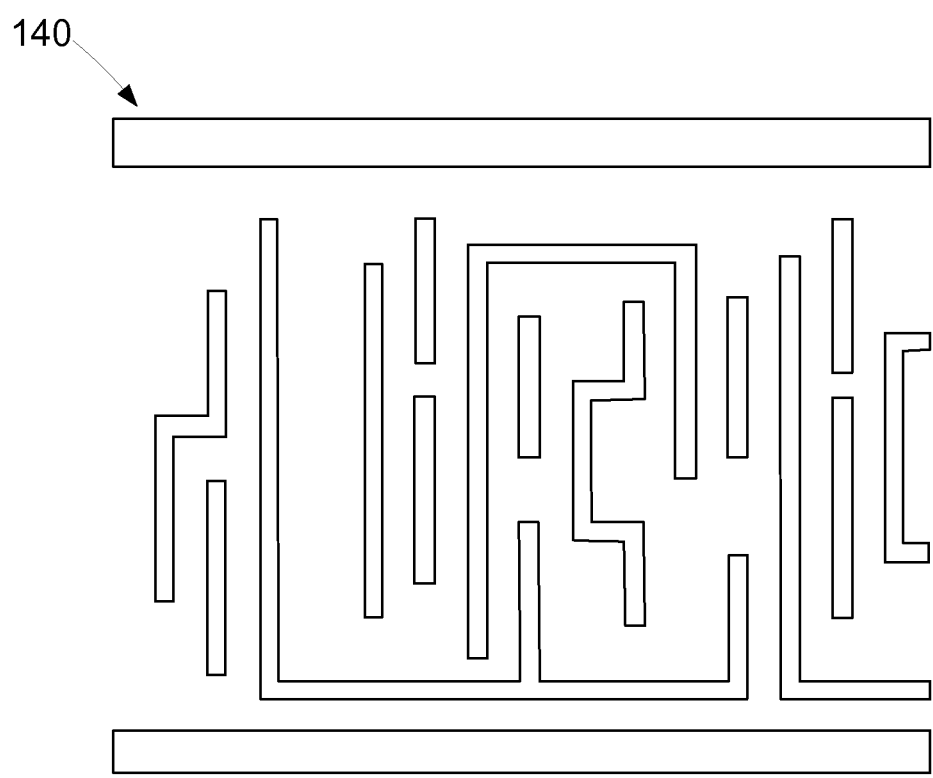
FIGS. 6A-6C depict yet another illustrative example of how the methods disclosed herein may be employed to reduce the number of multi-polygon constraint rule violations on a decomposed circuit layout.
Figure 6B:
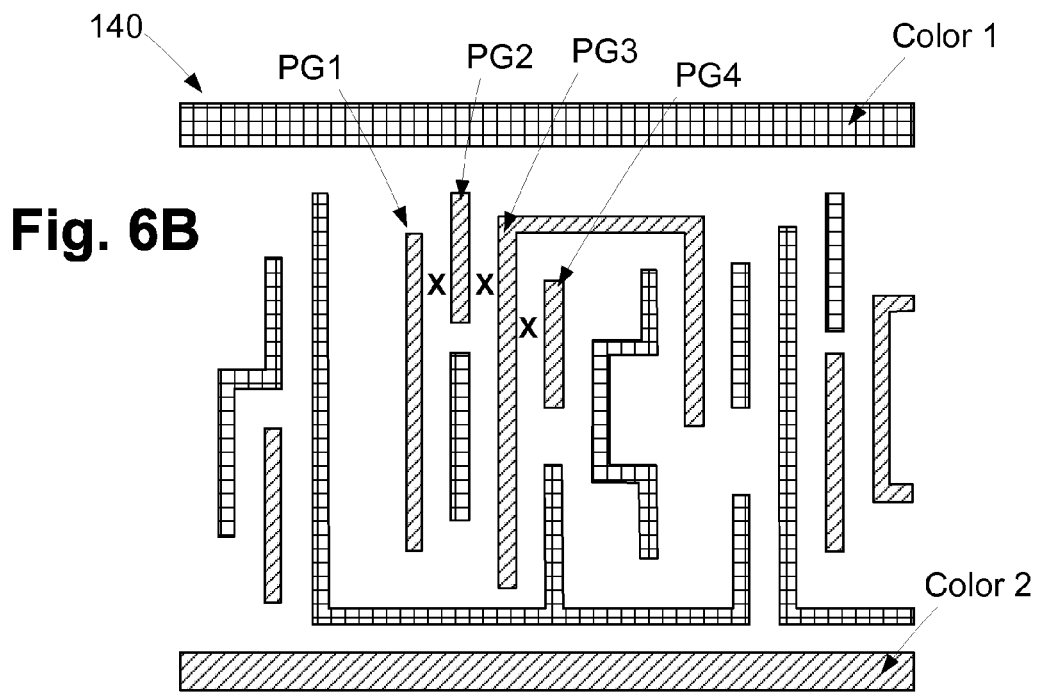
Figure 6C:
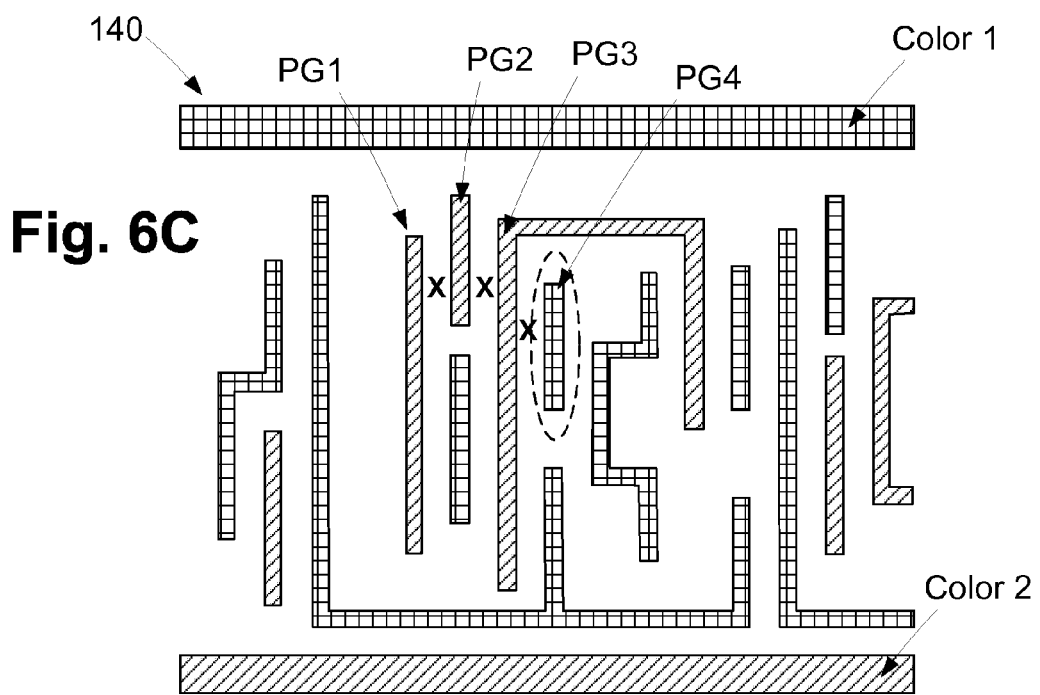

FIGS. 6A-6C depict yet another illustrative example of how the methods disclosed herein may be employed to reduce the number of multi-polygon constraint rule violations on a decomposed circuit layout. FIG. 6A depicts an original circuit layout 140 that must be manufactured using double patterning techniques. FIG. 6B depicts the layout after it has been decomposed into two different masks (Color 1 and Color 2) that are indicated by different shading. As indicated, the Color 2 mask contains a four-polygon pattern, PG1-PG4. The "X" in FIG. 6B indicates a situation where the spacing between the adjacent polygons is less than the value of the multi-polygon constraint rule. Accordingly, the four-polygon pattern reflected in the Color 2 mask cannot be manufactured. FIG. 6C depicts an example of where the methods disclosed herein were used to eliminate the violating pattern in the Color 2 mask. More specifically, FIG. 6C depicts a situation where the "FIRST PASS" aspects (FIG. 3, block 112) of the methods disclosed was performed on the Color 2 mask, but were not successful in eliminating the violating pattern. Thus, in this example, the "SECOND PASS" aspect (FIG. 3, block 116) of the methods disclosed herein is performed on the Color 2 mask was used to eliminate the violating four-polygon pattern by recoloring PG4 such that it is now on the Color 1 mask. Accordingly, the three polygon pattern reflected in the modified Color 2 mask depicted in FIG. 6C can be manufactured.

The methods and systems disclosed herein have been employed and demonstrated great utility. More specifically, one or more of the methods disclosed herein was employed on a layout of an integrated circuit that was decomposed into two masks: Color 1 and Color 2. Using the methods disclosed herein, by just performing the FIRST PASS portion (FIG. 3, block 112) of the methods disclosed herein, between about half (44 or 56%) of the multi-polygon constraint rule violations were eliminated on the two colored masks. By performing both the FIRST PASS (FIG. 3, block 112) and the SECOND PASS (FIG. 3, block 116) on the two masks, more than 99 percent of the multi-polygon constraint rule violations were removed. The table below reflects the foregoing data.

| Mask | No. of three-body constraint rule violations as decomposed | No. of violations after FIRST PASS | Corrected Percentage after FIRST PASS | No. of violations after SECOND PASS | Corrected Percentage after FIRST and SECOND PASSES |
|---|---|---|---|---|---|
| Color 1 | 6994 | 3872 | 44.64% | 32 | 99.54% |
| Color 2 | 5394 | 2320 | 56.99% | 16 | 99.70% |

From the foregoing, it should be clear to those skilled in the art that the methods and systems disclosed herein may provide great benefit and advantages to layout designers. More specifically, the methods disclosed provide an efficient and effective means of eliminating patterns that violate a multi-polygon constraint rule. Importantly, using the novel methods disclosed herein, the elimination of many, if not all, of such violating patterns may be accomplished using EDA tools without the need for manual intervention to change the original circuit layout.

As is evident from the discussion above, some features of the subject matter disclosed herein may be implemented in software. For instance, some or all of the various acts described above may be software-implemented, in whole or in part. Thus, some features or acts of the presently disclosed inventions may be implemented as instructions encoded on a computer-readable, program storage medium. The program storage medium may be of any type suitable to the particular implementation. However, the program storage medium will typically be magnetic, such as the floppy disk, a computer, a hard disk drive, an optical disk, etc. When these instructions are executed by a computer, they perform the disclosed functions. The computer may be a desktop computer or, alternatively, the computer may be an embedded processor. The computer might also be a laptop, a workstation or a mainframe in various other embodiments. Thus, the scope of the invention should not be considered to be limited by the type or nature of the program storage medium or computer with which embodiments of the invention might be implemented.

Thus, some portions of the detailed descriptions herein are, or may be, presented in terms of algorithms, functions, techniques and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared and otherwise manipulated.

It has proven convenient at times, principally for reasons of common usage, to refer to these signals as bits, values, elements, symbols, characters, terms, numbers and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying" and the like used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   decomposing an initial circuit layout into first and second mask patterns;
   for said first mask pattern, identifying a first four-polygon pattern in said first mask pattern that violates a multi-polygon constraint rule, wherein said first four-polygon pattern comprises four polygons positioned side-by-side in said first mask pattern; and
   recoloring one or two of the polygons in said first four-polygon pattern in said first mask pattern to said second mask pattern to eliminate said first four-polygon pattern from said first mask pattern without introducing any design rule violations in said first mask pattern, wherein at least the steps of identifying said first four-polygon pattern and of recoloring said one or two of the polygons in said first four-polygon pattern are implemented by executing, autonomously with a computer, instructions that are encoded on a computer-readable program storage medium.

2. The method of claim 1, further comprising:
   for said second mask pattern, identifying a second four-polygon pattern in said second mask pattern that violates said multi-polygon constraint rule, wherein said second four-polygon pattern comprises four polygons positioned side-by-side in said second mask pattern;
   recoloring one or two of the polygons in said second four-polygon pattern in said second mask pattern to said first mask pattern to eliminate said second four-polygon pattern from said second mask pattern without introducing any design rule violations in said second mask pattern.

3. The method of claim 2, wherein said second four-polygon pattern comprises two outer polygons and two inner polygons positioned between said two outer polygons and wherein said step of recoloring one or two of the polygons in said second four-polygon pattern in said second mask pattern to said first mask pattern comprises recoloring one of said two inner polygons in said second four-polygon pattern to said first mask pattern while leaving said two outer polygons of said second four-polygon pattern in said second mask pattern.

4. The method of claim 2, wherein said second four-polygon pattern comprises two outer polygons and two inner polygons positioned between said two outer polygons and wherein said step of recoloring one or two of the polygons in said second four-polygon pattern in said second mask pattern to said first mask pattern comprises recoloring at least one of said two outer polygons in said second four-polygon pattern to said first mask pattern while leaving said two inner polygons of said second four-polygon pattern in said second mask pattern.

5. The method of claim 1, wherein said first four-polygon pattern comprises two outer polygons and two inner polygons positioned between said two outer polygons and wherein said step of recoloring one or two of the polygons in said first four-polygon pattern in said first mask pattern to said second mask pattern comprises recoloring one of said two inner polygons in said first four-polygon pattern to said second mask pattern while leaving said two outer polygons of said first four-polygon pattern in said first mask pattern.

6. The method of claim 1, wherein said first four-polygon pattern comprises two outer polygons and two inner polygons positioned between said two outer polygons and wherein said step of recoloring one or two of the polygons in said first four-polygon pattern in said first mask pattern to said second mask pattern comprises recoloring at least one of said two outer polygons in said first four-polygon pattern to said second mask pattern while leaving said two inner polygons of said first four-polygon pattern in said first mask pattern.

7. The method of claim 1, wherein the step of decomposing said initial circuit layout into said first and second mask patterns is implemented by executing, with said computer, said instructions that are encoded on said computer-readable program storage medium.

8. The method of claim 1, wherein, prior to decomposing said initial circuit layout, all polygons comprising said initial circuit layout are colorless, wherein decomposing said initial circuit layout into said first and second mask patterns comprises coloring each polygon comprising said first mask pattern a first mask color and coloring each polygon comprising said second mask pattern a second mask color, and wherein recoloring said one or two of the polygons in said first four-polygon pattern comprises recoloring said one or two of the polygons from said first mask color to said second mask color.

9. A method, comprising:
  decomposing an initial circuit layout into first and second mask patterns;
  for said first mask pattern, identifying first and second four-polygon patterns in said first mask pattern that violate a multi-polygon constraint rule, wherein each of said first and second four-polygon patterns comprises two outer polygons and two inner polygons positioned between said two outer polygons;
  recoloring one of said two inner polygons in said first four-polygon pattern to said second mask pattern while leaving said two outer polygons of said first four-polygon pattern in said first mask pattern to eliminate said first four-polygon pattern from said first mask pattern without introducing any design rule violations in said first mask pattern; and
  recoloring at least one of said two outer polygons in said second four-polygon pattern to said second mask pattern while leaving said two inner polygons of said second four-polygon pattern in said first mask pattern to eliminate said second four-polygon pattern from said first mask pattern without introducing any design rule violations in said first mask pattern, wherein at least the steps of identifying said first and second four-polygon patterns, of recoloring said one of said two inner polygons in said first four-polygon pattern, and of recoloring said at least one of said two outer polygons in said second four-polygon pattern are implemented by executing, autonomously with a computer, instructions that are encoded on a computer-readable program storage medium.

10. The method of claim 9, wherein said recoloring at least one of said two outer polygons in said second four-polygon pattern comprises recoloring both of said two outer polygons in said second four-polygon pattern to said second mask pattern.

11. The method of claim 9, wherein the step of decomposing said initial circuit layout into said first and second mask patterns is implemented by executing, with said computer, said instructions that are encoded on said computer-readable program storage medium.

12. The method of claim 9, wherein, prior to decomposing said initial circuit layout, all polygons comprising said initial circuit layout are colorless, wherein decomposing said initial circuit layout into said first and second mask patterns comprises coloring each polygon comprising said first mask pattern a first mask color and coloring each polygon comprising said second mask pattern a second mask color, wherein recoloring said one of said two inner polygons in said first four-polygon pattern comprises recoloring said one of said two inner polygons from said first mask color to said second mask color, and wherein recoloring said at least one of said two outer polygons in said second four-polygon pattern comprises recoloring said at least one of said two outer polygons from said first mask color to said second mask color.

13. A method, comprising:
  decomposing an initial circuit layout into first and second mask patterns;
  for said first mask pattern, identifying first and second four-polygon patterns in said first mask pattern that violate a multi-polygon constraint rule, wherein each of said first and second four-polygon patterns comprises two outer polygons and two inner polygons positioned between said two outer polygons; and
  recoloring at least one of said two inner polygons in said first four-polygon pattern to said second mask pattern while leaving said two outer polygons of said first four-polygon pattern in said first mask pattern to eliminate said first four-polygon pattern from said first mask pattern without introducing any design rule violations in said first mask pattern, wherein at least the steps of identifying said first and second four-polygon patterns and of recoloring said at least one of said two inner polygons in said first four-polygon pattern are implemented by executing, autonomously with a computer, instructions that are encoded on a computer-readable program storage medium.

14. The method of claim 13, wherein said recoloring at least one of said two inner polygons in said first four-polygon pattern comprises recoloring both of said two inner polygons in said first four-polygon pattern to said second mask pattern.

15. The method of claim 13, wherein the step of decomposing said initial circuit layout into said first and second mask patterns is implemented by executing, with said computer, said instructions that are encoded on said computer-readable program storage medium.

16. The method of claim 13, wherein, prior to decomposing said initial circuit layout, all polygons comprising said initial circuit layout are colorless, wherein decomposing said initial circuit layout into said first and second mask patterns comprises coloring each polygon comprising said first mask pattern a first mask color and coloring each polygon comprising said second mask pattern a second mask color, and wherein recoloring said at least one of said two inner polygons in said first four-polygon pattern comprises recoloring said at least one of said two inner polygons from said first mask color to said second mask color.

17. A method, comprising:
  decomposing an initial circuit layout into first and second mask patterns;
  for said first mask pattern, identifying first and second four-polygon patterns in said first mask pattern that violate a multi-polygon constraint rule, wherein each of said first and second four-polygon patterns comprises two outer polygons and two inner polygons positioned between said two outer polygons; and
  recoloring at least one of said two outer polygons in said second four-polygon pattern to said second mask layer while leaving said two inner polygons of said second four-polygon pattern in said first mask pattern to eliminate said second four-polygon pattern from said first mask pattern without introducing any design rule violations in said first mask pattern, wherein at least the steps of identifying said first and second four-polygon patterns and of recoloring said at least one of said two outer polygons in said second four-polygon pattern are implemented by executing, autonomously with a computer, instructions that are encoded on a computer-readable program storage medium.

18. The method of claim 17, wherein said recoloring at least one of said two outer polygons in said second four-polygon pattern comprises recoloring both of said two outer polygons in said second four-polygon pattern to said second mask pattern.

19. The method of claim 17, wherein the step of decomposing said initial circuit layout into said first and second mask patterns is implemented by executing, with said computer, said instructions that are encoded on said computer-readable program storage medium.

20. The method of claim 17, wherein, prior to decomposing said initial circuit layout, all polygons comprising said initial circuit layout are colorless, wherein decomposing said initial circuit layout into said first and second mask patterns comprises coloring each polygon comprising said first mask pattern a first mask color and coloring each polygon comprising said second mask pattern a second mask color, and wherein recoloring said at least one of said two outer polygons in said second four-polygon pattern comprises recoloring said at least one of said two outer polygons from said first mask color to said second mask color.

* * * * *